United States Patent [19]
Rothenberger et al.

[11] Patent Number: 5,731,725
[45] Date of Patent: *Mar. 24, 1998

[54] PRECISION DELAY CIRCUIT

[75] Inventors: Roland D. Rothenberger, Poway; Greg T. Sullivan; Kenny Yifeng Tung, both of Escondido, all of Calif.

[73] Assignee: Unisys Corporation, Blue Bell, Pa.

[*] Notice: The term of this patent shall not extend beyond the expiration date of Pat. No. 5,594,690.

[21] Appl. No.: 573,304

[22] Filed: Dec. 15, 1995

[51] Int. Cl.[6] .......................... H03K 5/13; H03K 5/159
[52] U.S. Cl. .................... 327/262; 327/276; 327/281; 327/279
[58] Field of Search ........................ 327/261, 265, 327/276–278, 279, 281, 284–286, 288, 392–396, 398–401, 403, 404, 172, 176, 292

[56] References Cited

U.S. PATENT DOCUMENTS

| | | | |
|---|---|---|---|
| 4,616,788 | 10/1986 | Backes et al. | 327/281 |
| 4,797,585 | 1/1989 | Segawa et al. | 327/172 |
| 5,012,142 | 4/1991 | Sonntag | 327/281 |
| 5,175,453 | 12/1992 | Chang et al. | 327/286 |
| 5,185,540 | 2/1993 | Boudry | 327/281 |
| 5,307,028 | 4/1994 | Chen | 331/1 A |
| 5,489,864 | 2/1996 | Ashuri | 327/292 |
| 5,497,263 | 3/1996 | Masuda et al. | 327/281 |
| 5,521,540 | 5/1996 | Marbot | 327/284 |
| 5,594,690 | 1/1997 | Rothenberger et al. | 327/262 |

FOREIGN PATENT DOCUMENTS

| | | | |
|---|---|---|---|
| 61-237512 | 10/1986 | Japan | 327/277 |
| 4-167613 | 6/1992 | Japan | 327/281 |
| 4-334113 | 11/1992 | Japan | 327/172 |
| 4-358412 | 12/1992 | Japan | 327/172 |

*Primary Examiner*—Timothy P. Callahan
*Assistant Examiner*—Eunsa Shin
*Attorney, Agent, or Firm*—Charles J. Fassbender; Mark T. Starr; Steven R. Petersen

[57] ABSTRACT

A precision delay circuit in an integrated circuit chip includes a transistor switching circuit in combination with a control circuit and a compensation circuit. The transistor switching circuit receives an input signal; and in response, the transistors switch on and off at an unpredictable speed to generate an output signal with a delay that has a large tolerance. The control circuit estimates the unpredictable speed at which the transistors switch and it generates control signals that identify the estimated speed. The compensation circuit includes a plurality of compensation components for the transistor switching circuit. This compensation circuit receives the control signals from the control circuit; and in response, it selectively couples the compensation components to the transistor switching circuit such that the combination of the transistors and the selectively coupled components generates the output signal with a precise delay that has an insignificant tolerance.

13 Claims, 11 Drawing Sheets

PRECISION DELAY CIRCUIT

BACKGROUND OF THE INVENTION

This invention relates to the structure and operation of precision delay circuits in an integrated circuit chip.

In the prior art, delay circuits have been conventionally structured in an integrated circuit chip as a serial string of several inverter gates. This is illustrated in Fig. i by the serial string of N inverters 10-1 through 10-N. Each of the inverters is comprised of a P-channel transistor 10a and an N-channel transistor 10b; and these two transistors are shown in Fig. 1 only for the first inverter 10-1 in order to simplify the drawing.

In operation, a digital input signal $v_i$ is applied to an input terminal 10c of the first inverter 10-1. When signal $v_i$ is high, transistor 10a is off and transistor 10b is on; whereas when signal $v_i$ is low, transistor 10a is on and transistor 10b is off. Thus, any low-to-high transition (or high-to-low transition) in signal $v_i$ sequentially switches the on/off state of the transistors 10a and 10b in each of the inverters to thereby generate an output signal $v_o$ which is a delayed replica of the input signal $v_i$. To increase the delay between the input signal $v_i$ and the output signal $v_o$, the total number N of inverters is increased; and vice-versa.

Also in the prior art, the above-described serial string of inverter gates is conventionally used in conjunction with art AND gate 11 to generate a pulse signal $v_p$. In the case where the total number of inverters N is odd, the pulse $v_p$ begins when the digital input signal $v_i$ makes a low-to-high transition; and that pulse $v_p$ lasts until the input signal transition propagates through the last inverter 10-N.

However, a major problem with the FIG. 1 circuits is that the delay in the output signal $v_o$ and the width of the pulse signal $v_p$ has a large tolerance. Such a large tolerance occurs because on any one particular integrated circuit chip, the transistors 10a and 10b in the inverters 10-1 through 10-N switch on and off at an unpredictable speed. This is illustrated by a graph in FIG. 2 wherein a range of switching speeds is given on the horizontal axis, and the corresponding probability for any particular switching speed to occur in the transistors 10a and 10b is given by a curve 12.

Inspection of curve 12 shows that the transistors 10a and 10b on any one particular chip have an unpredictable switching speed which can be anywhere between the slowest speed 13a to the fastest speed 13b. In other words, the switching speed of the transistors 10a and 10b has a tolerance $\Delta_1$ which occurs about a mean speed 13c that lies midway between the slowest speed 13a and the fastest speed 13b. This switching speed tolerance $\Delta_1$ arises due to certain unavoidable variations in the process by which the transistors 10a and 10b are fabricated. Two such process variations are identified in FIG. 2 by reference numeral 14 as variations in the translstor's gate length and variations in the thickness of the transistor's gate oxide.

Due to the large switching speed tolerance $\Delta_1$ of FIG. 2, the delayed output siGnal voand the pulse output signal $v_p$ are generated with a proportionately large tolerance $k\Delta_1$ as shown in FIG. 3. Signal $v_o$ occurs with a minimum delay 15a, a maximum delay 15b, and a mean delay 15c which respectively correspond to the switching speeds 13a, 13b, and 13c. Similarly, the output pulse $v_p$ occurs with a minimum width 16a, a maximum width 16b, and a mean width 16c which respectively correspond to the switching speeds of 13a, 13b and 13c.

In order for the delayed output signal $v_o$ to occur with precision, the delay tolerance of $k\Delta_1$ must be small in comparison to the mean delay 15c. Likewise, in order for the pulse output signal vp to have a precise width, the width tolerance of $k\Delta_1$ must be small in comparison to the mean width 16c. Unfortunately, however, the process variations 14 become more and more significant as the physical size of the transistors 10a and 10b get smaller and smaller. For submicron transistors having a mean size of 0.50 µm, the delay tolerance $k\Delta_1$ is about 90% of the mean 15c.

Accordingly, one object of the invention is to provide a novel integrated circuit which generates an output signal as a delayed replica of an input signal with a substantially smaller tolerance in the delay than the prior art.

Another object of the invention is to provide a novel integrated circuit which generates an output pulse in response to an input signal with a substantially smaller tolerance in the pulse width than the prior art.

BRIEF SUMMARY OF THE INVENTION

In accordance with the present invention, a precision delay circuit is constructed in an integrated circuit chip by providing a transistor switching circuit in combination with a control circuit and a compensation circuit. The transistor switching circuit receives an input signal; and in response, the transistors switch on and off at an unpredictable speed to generate an output signal with a delay that has a large tolerance. The control circuit estimates the unpredictable speed at which the transistors switch and it generates control signals that identify the estimated speed. The compensation circuit includes a plurality of compensation components for the transistor switching circuit. This compensation circuit receives the control signals from the control circuit; and in response, it selectively couples the compensation components to the transistor switching circuit such that the combination of the transistors and the selectively coupled components generates the output signal with a precise delay that has an insignificant tolerance.

Preferably, the control circuit includes one module which generates an oscillating signal that oscillates at a frequency which is proportional to the unpredictable speed at which the transistors switch, and another module which generates the control signals by counting cycles in the oscillating signal. Preferably, the compensation circuit couples a small capacitance to the transistor switching circuit when the control signals estimate a slow switching speed, and couple larger capacitors to the transistor switching circuit when the control signals estimate faster speeds.

BRIEF DESCRIPTION OF THE DRAWINGS

FIG. 16b shows a circuit which is an alternative to the circuit of FIG. 16a.

DETAILED DESCRIPTION

Figure 4:
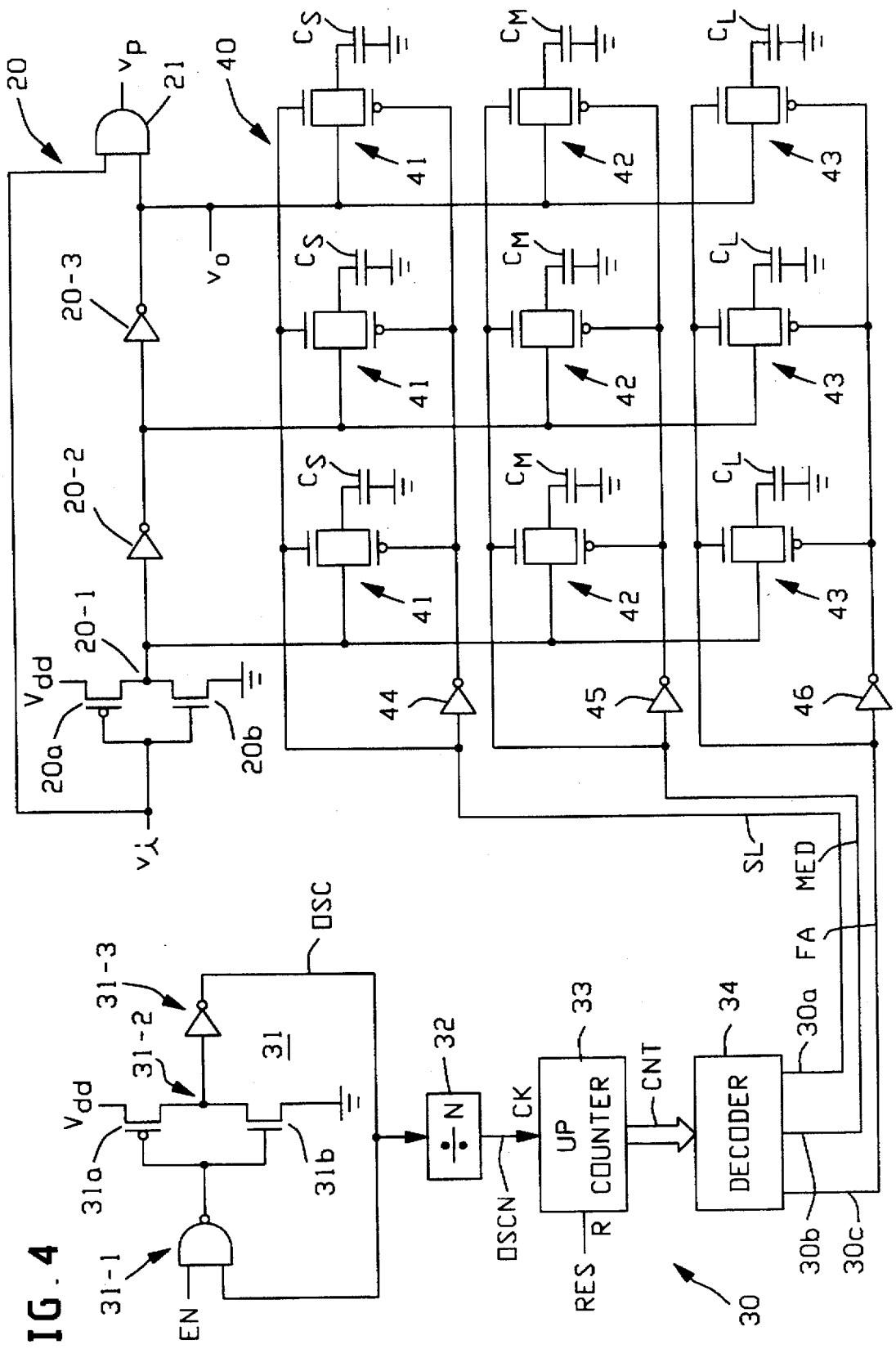
FIG. 4 is a circuit diagram of one preferred embodiment of a precision delay/pulse generating circuit which incorporates the present invention.

With reference now to FIG. 4, one embodiment of a precision delay circuit, which incorporates the present invention, will be described in detail. This FIG. 4 embodiment is comprised of three modules which are identified by reference numerals 20, 30 and 40; and all three modules are in a single integrated circuit chip.

Figure 1:
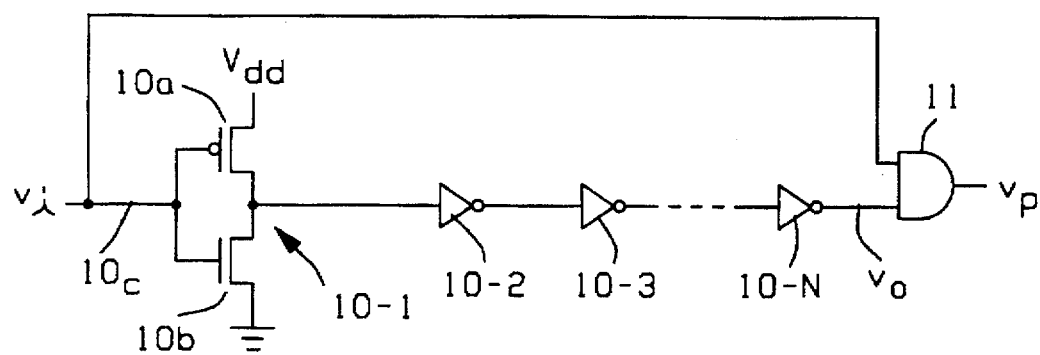
Fig. 1 is a circuit diagram of a delay/pulse generating circuit of the prior art.

Module 20 is a transistor switching circuit which is the same as the previously described prior art circuit of FIG. 1. Included within module 20 is a serial string of three inverters 20-1, 20-2, and 20-3; and those inverters respectively correspond to the inverters 10-1, 10-2 and 10-3 of FIG. 1. Also, included in module 20 is an AND gate 21 which corresponds to the previously described AND gate 11 in FIG. 1.

Since module 20 is the same as the prior art Fig. i circuit, it follows that the delay in output signal $v_o$ and the width of output pulse $v_p$ will have a large tolerance when the module 20 operates in isolation from the other two modules 30 and 40. This large tolerance occurs because the transistors 20a and 20b in the inverters 20-1 through 20-3 switch on and off with an unpredictable speed as was described in conjunction with FIGS. 2 and 3. By comparison, when Module 20 interacts with the other two modules 30 and 40, that large tolerance is substantially reduced.

Module 30 is a control circuit which estimates the speed at which the transistors 20a and 20b within the inverters 20-1 through 20-3 switch on and off. As an output, module 30 generates control signals which identify the estimated switching speed. In the FIG. 4 embodiment, the estimated switching speed has three quantized values of slow, medium and fast. An estimate of a slow switching speed causes signal SL to go high on an output 30a; an estimate of a medium switching speed causes signal MED to go high on an output 30b; and an estimate of a fast switching speed causes signal FA to go high on an output 30c.

Within module 30, the three control signals of SL, MED and FA are generated by a ring oscillator 31, a divide by N circuit 32, an up-counter 33, and a decoder 34. All of these components are interconnected to each other as shown.

Ring oscillator 31 is made up of one NAND gate 31-1 plus two inverters 31-2 and 31-3. When an enable signal EN to the NAND gate 31-1 is low, the ring oscillator 31 is inhibited from oscillating and generates a high output signal OSC. Conversely, when signal EN is high, the output signal OSC from the ring oscillator 31 oscillates at a frequency which is proportional to the switching speed of the transistors 31a and 31b within the NAND gate 31-1 and the two inverters 31-2 and 31-3.

Those transistors 31a and 31b in the ring oscillator 31 switch on and off at essentially the same speed as the transistors 20a and 20b within the inverters 20-1 through 20-3 of module 20. This correspondence in switching speed occurs because all of the transistors in the modules 20, 30 and 40 are fabricated on the same integrated circuit chip at the same time; and consequently, the particular physical tolerances which those transistors have will track each other.

For example, if the transistors 20a and 20b in the inverters 20-1 through 20-3 have a gate oxide thickness which is less than the mean, then the transistors 31a and 31b in the ring oscillator will also have essentially that same thin gate oxide. Similarly, if the transistors 20a and 20b in the inverters 20-1 through 20-3 have a gate length which is less than the mean, then the transistors 31a and 31b in the ring oscillator will also have essentially the same short gate length.

Signal OSC from the ring oscillator 31 is sent to the divide by N circuit 32; and in response, that circuit generates an output signal OSCN. Signal OSCN is the same as the signal OSC except that it is reduced in frequency by a factor of N.

Signal OSCN is sent to a clock input CK on the up-counter 33; and, that counter also receives a reset signal RES on a reset input R. When signal RES is high, the counter 33 is reset to a count of zero; whereas when signal RES is low, the counter 33 counts up by one for each low-to-high transition which occurs in the signal OSCN.

Thus, by resetting the counter 33 and subsequently enabling the ring oscillator 30 for a predetermined time interval, a count is generated in the up-counter 33 which indicates the speed at which the transistors 20a and 20b switch on and off. As the switching speed of those transistors 20a and 20b is increased, the corresponding count in the up-counter 33 also increases; and vice-versa.

From the up-counter 33, the count signals CNT are sent to the decoder 34. There, the count is quantized by determining if it falls within a "small" range or a "medium" range or a "large" range. A count which is small (SL=1) indicates that the transistors switch at a slow speed; a count which is medium (MED=1) indicates that the transistors switch at a medium speed; and a count which is large (FA=1) indicates that the transistors switch at a fast speed.

Each of the output signals SL, MED and FA from module 30 are sent as inputs to module 40 which is a compensation circuit. This compensation circuit includes three small capacitors $C_S$, three medium capacitors $C_M$, three large capacitors $C_L$, three sets of pass gates 41-43, and three inverters 44-46. Each pass gate consists of one N-channel transistor and one P-channel transistor. All of these components are interconnected as shown.

When signal SL is high, module 40 couples the small capacitors $C_S$ through the pass gates 41 to the serial string of inverters 20-1 through 20-3. When signal MED is high, module 40 couples the medium capacitors $C_M$ though the pass gates 42 to the serial string of inverters 20-1 through 20-3. When the control signal FA is high, module 40 couples the large capacitors $C_L$ through the pass gates 43 to the serial string of inverters 20-1 through 20-3.

By coupling the small capacitors $C_S$ to the inverters 20-1 through 20-3, a small delay is added to the output signal $v_o$ because the small capacitors charge and discharge is a short time interval. Similarly, by coupling the medium capacitors CM to the inverters 20-1 through 20-3, a medium delay is added to the output signal $v_o$. Likewise, by coupling the large capacitors $C_L$ to the inverters 20-1 through 20-3, a large delay is added to the output signal $v_o$.

These added delays substantially reduce the tolerance in the total delay of the output signal $v_o$ because they compensate for variations in the switching speed of the transistors 20a and 20b. If those transistors switch in the fast speed range, then a large delay is added; if they switch in the medium speed range, then a medium delay is added; and if they switch in the slow speed range, then a small delay is added.

Figure 5:
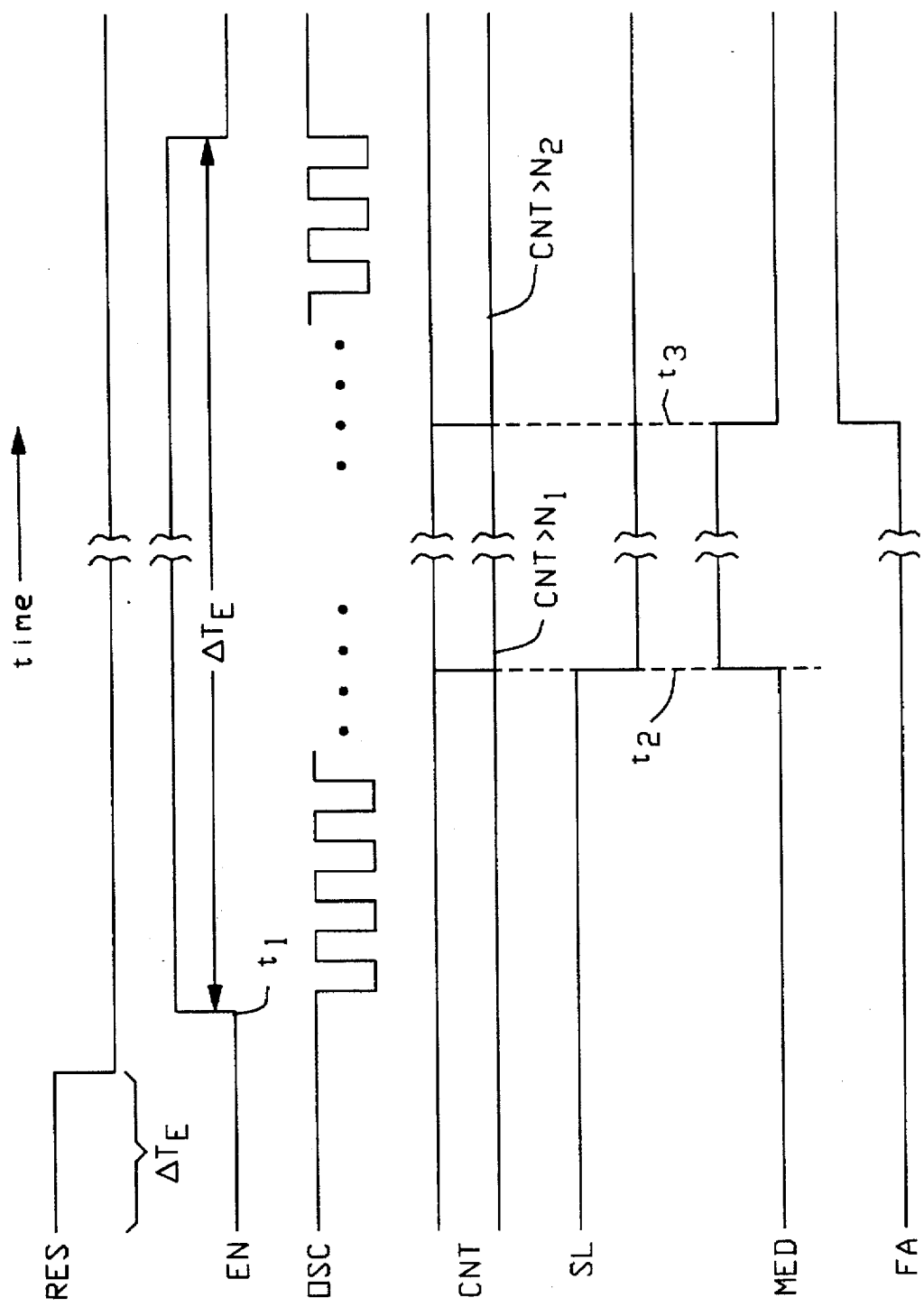
FIG. 5 is a set of signal waveforms which occur in the FIG. 4 circuit.

A timing diagram which illustrates the operation of the control module 30 and the compensation module 40 is shown in FIG. 5. There, the up-counter 33 is reset to a count of zero by the reset signal RES being high during a time interval $\Delta T_R$. Thereafter, at time $t_1$, the enable signal EN goes high; and in response, signal OSC from the ring oscillator 31 starts to oscillate.

Each low-to-high transition in the ring oscillator signal OSC causes the up-counter 33 to increment the count signal CNT by one. As long as that count does not exceed a predetermined number $N_1$, the control signal SL from the decoder 34 will be high; and in FIG. 5, this occurs up to a time instant $t_2$. At that time, the count exceeds the number $N_1$ and thus control signal SL goes low while control signal MED goes high.

Signal MED stays high as long as the count in the up-counter 33 does not exceed another predetermined number $N_2$. In FIG. 5, the count $N_2$ is shown as being exceeded at time instant $t_3$. When that occurs, control signal MED goes low while control signal FA goes high.

After the enable signal EN has been high for a predetermined time internal $\Delta T_E$, the enable signal EN goes low; and that causes the ring oscillator to stop oscillating. Consequently, the count signals CNT and the control signals SL, MED, and FA maintain the state which they have at the end of the time interval $\Delta T_E$.

Figure 2:
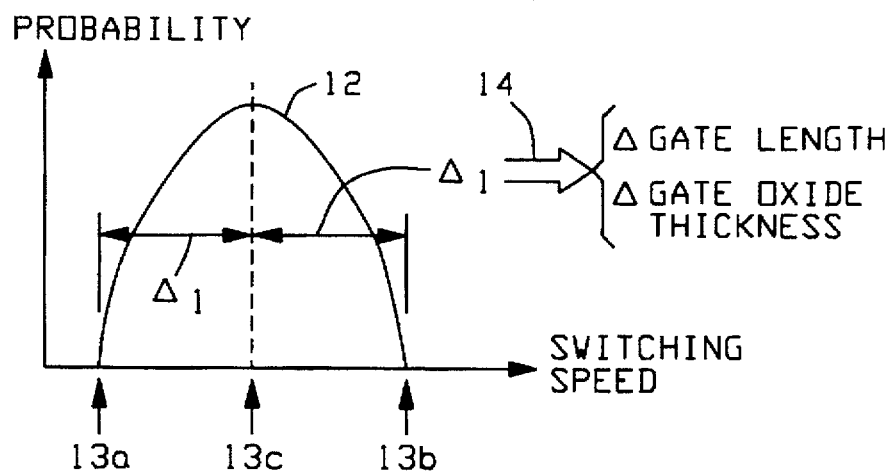
FIG. 2 is a graph which shows a range of switching speeds for the transistors in the Fig. 1 circuit.
Figure 3:
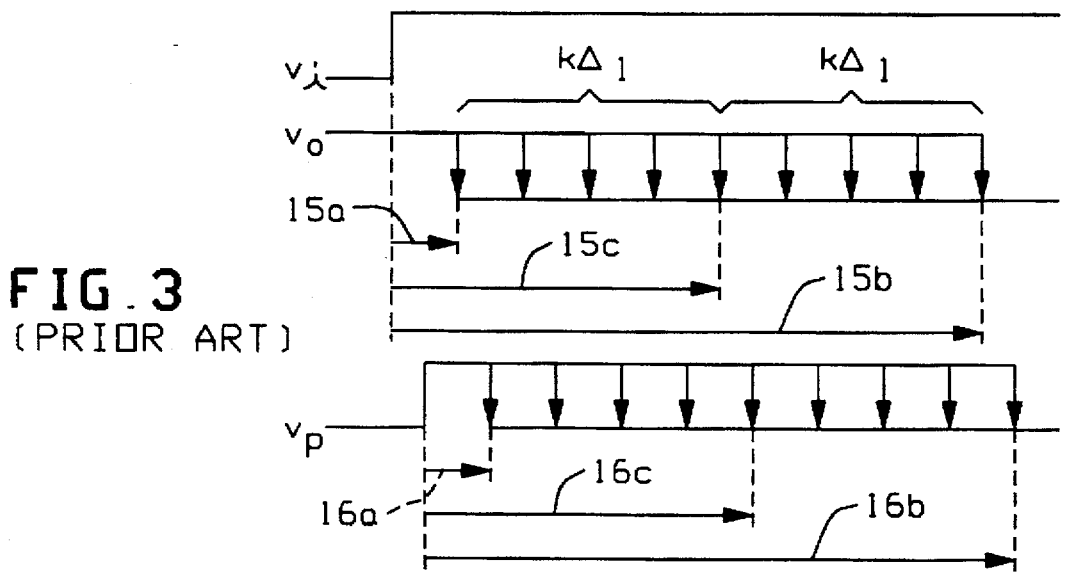
FIG. 3 is a set of signal waveforms which occur in the FIG. 1 circuit.
Figure 6:
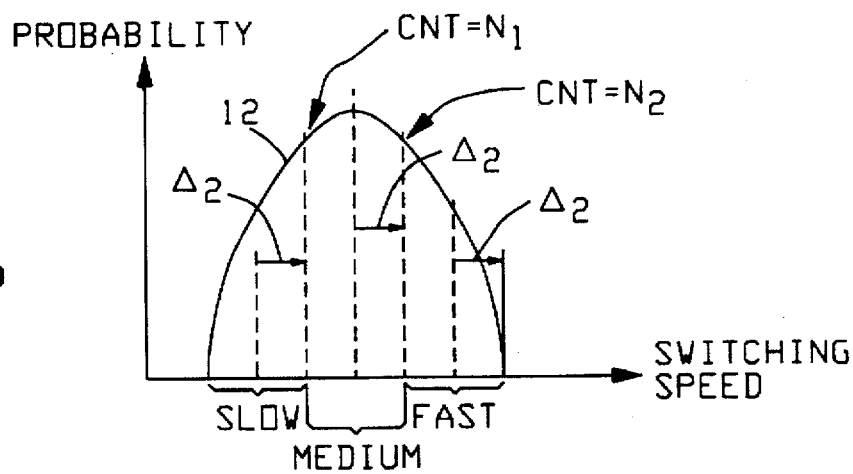
FIG. 6 is a graph which explains how certain compensation components in the FIG. 4 circuit are used depending upon the switching speed of the transistors in the FIG. 4 circuit.
Figure 7:
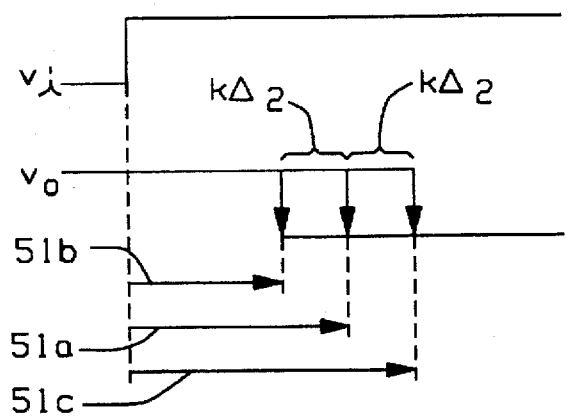
FIG. 7 shows how an output signal from the Fig. 4 circuit has a precise delay even though the transitors in the FIG. 4 circuit have a wide range of switching speeds.

Considering now FIGS. 6 and 7, they illustrate the degree to which the tolerance in the output signals $v_o$ and $v_p$ is reduced by the application of the control signals SL, MED, and FA to the compensation module 40. In FIG. 6, the graph of FIG. 2 is repeated wherein the range of switching speeds for the transistors 20a and 20b is given on the horizontal axis and the corresponding probability for any particular switching speed to occur is given by the curve 12.

Also in FIG. 6, the range of switching speeds on the horizontal axis is partitioned into three equal width sub-ranges of slow, medium and fast. Control signal SL is high when the switching speed is in the slow sub-range; control signal MED is high when the switching speed is in the medium sub-range; and control signal FA is high indicates when the switching speed is in the fast sub-range.

Capacitance $C_S$ is selected such when the switching speed of the transistors 20a and 20b is at the middle of the slow sub-range, then the output signal $v_o$ from module 20 will have an ideal predetermined delay 51a. However, within that slow speed sub-range, the speed of the transistors 20a and 20b have a tolerance $\Delta_2$ as is shown in FIG. 6. Consequently, when the switching speed of the transistors 20a and 20b is at the high end of the slow switching speed sub-range, the output signal $v_o$ from module 20 will have a tolerance $k\Delta_2$ which is shown in FIG. 7 by reference numeral 51b. Similarly, when the switching speed of the transistors 20a and 20b is at the low end of the slow switching speed sub-range, the output signal $v_o$ from module 20 will have a tolerance $k\Delta_2$ which is shown in Fig. 7 by reference numeral 51c.

Capacitance $C_M$ is selected such that when the switching speed of the transistors 20a and 20b is at the middle of medium sub-range, then the output signal $v_o$ from module 20 will again have the ideal predetermined delay 51a. Likewise, capacitance $C_L$ is selected such that when the switching speed of the transistors 20a and 20b is at the middle of the fast speed sub-range, then the output signal $v_o$ from module 20 will have the ideal predetermined delay 51a. However, within the medium and fast speed sub-ranges, the speed of the transistors 20a and 20b have the tolerance $\Delta_2$ as shown in FIG. 6. Thus, when the switching speed of the transistors 20a and 20b is at either the high end or the low end of the medium or the fast speed sub-ranges, the output signal $v_o$ from module 20 will have a tolerance $k\Delta_2$ as shown in FIG. 7.

By comparing the switching speed tolerance $\Delta_2$ which occurs in each speed sub-range (slow, medium and fast) to the overall switching speed tolerance $\Delta_1$ as shown in FIG. 2, it is seen that the sub-range tolerance $\Delta_2$ is one-third of the overall tolerance $\Delta_1$. Consequently, the corresponding tolerance $k\Delta_2$ which occurs in the delayed output signal $v_o$ of FIG. 7 is only one-third of the tolerance $k\Delta_1$ which occurs in the output signal $v_o$ of FIG. 3. This means that the control module 30 and compensation module 40 of FIG. 4 reduce the tolerance in the delayed output signal $v_o$ and the pulse signal $v_p$ from module 20 by 300%!

Both the structure and the operation of the FIG. 4 precision delay circuit have now been described in detail. In addition, however, many changes and modifications can be made to the details of this particular embodiment. For example, the serial string of three inverter 20-1 through 20-3 as shown in FIG. 4 can be replaced with a serial string of any number of inverters. For each such inverter in that serial string, the capacitors $C_S$, $C_M$, and $C_L$ need to be coupled through respective pass gates 41, 42, and 43 to the inverter output.

As another modification, the decoder 34 in the FIG. 4 circuit can be modified such that it quantizes the count from the counter 33 into any number of sub-ranges. For each such sub-range, a separate control signal from the decoder output must be generated; and for each such control signal, a separate group of compensation capacitors and pass gates must be provided.

For example, the decoder 34 can partition the count from the counter 33 into eight sub-ranges of equal width. In that case, the decoder 34 will generate eight control signals; and the three sets of capacitors $C_S$, $C_M$, and $C_L$ will be replaced by eight sets of capacitors with different magnitudes. The set of capacitors with the smallest magnitude is selected by the pass gates when the control signals indicate the count is in the smallest sub-range; the set of capacitors with the second smallest magnitude is selected by the pass gates when to the control signals indicate the count is in the second smallest sub-range; etc.

As another modification, the reset signal RES and the enable signal EN which are input signals to the control module 30 can be generated by any circuit as desired; and, that circuit can be integrated into the same chip which holds the modules 20–40 or it can be exterior to the chip. Likewise, the reset and enable signal sequence as shown in FIG. 5 can be initiated by any event as desired. For example, the FIG. 5 signal sequence can be initiated manually by a technician, or it can be initiated automatically by a logic signal from a microprocessor or sequential state machine.

Figure 8:
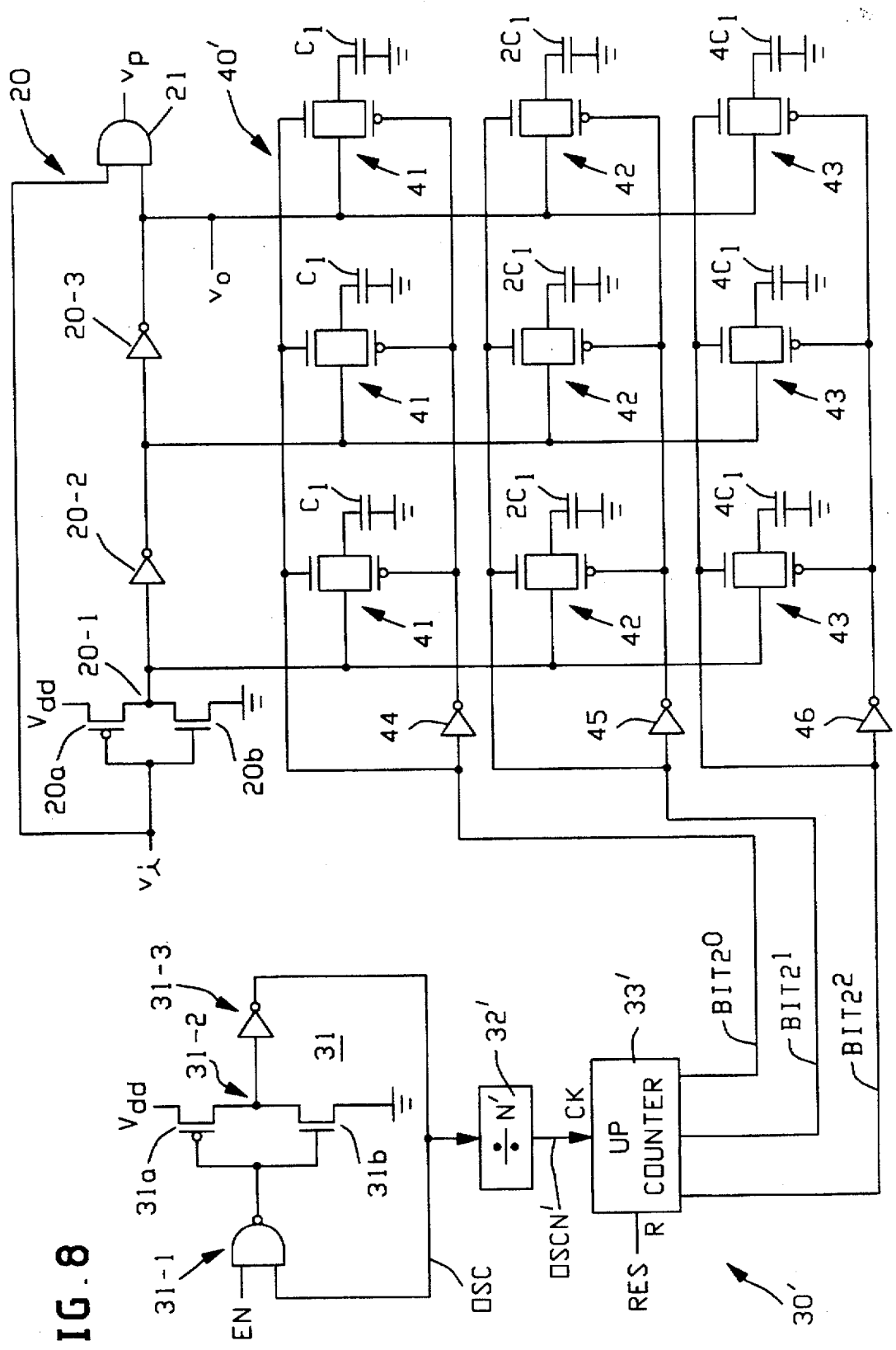
FIG. 8 is a circuit diagram of a second preferred embodiment of a precision delay/pulse generating circuit which incorporates the present invention.

As still another modification, the FIG. 4 embodiment can be changed as shown in FIG. 8. All of the components in FIG. 8 which occur identically in FIG. 4 have the same reference numeral; and all of the components in FIG. 8 which are modifications to the FIG. 4 components have the same reference numeral with a prime. For example, in FIG. 8, the previously described control module 30 is modified to control module 30'.

One of the modifications in control module 30' is that the up-counter 33' is a three-bit counter which is coupled directly to the compensation module 40'. In other words, in the FIG. 8 embodiment, there is no decoder on the output of the up-counter 33' which generates control signals that are sent to the compensation module 40'. Instead, those control signals come directly from the three-bit counter 33' as $BIT2^0$, $BIT2^1$, and $BIT2^2$ where $BIT2^0$ is the least significant bit of the count and $BIT2^2$ is the most significant bit of the count.

Also, a modification in the compensation module 40' is that the capacitors which are selected by the pass gates 41, 42, and 43 have magnitudes which are binary multiples of each other. Specifically, each of the pass gates 41 is connected to a capacitor of magnitude $C_1$; each of the pass gates 42 is connected to a capacitor of magnitude $2C_1$; and each of the pass gates 43 is connected to a capacitor of magnitude of $4C_1$.

Figure 9:
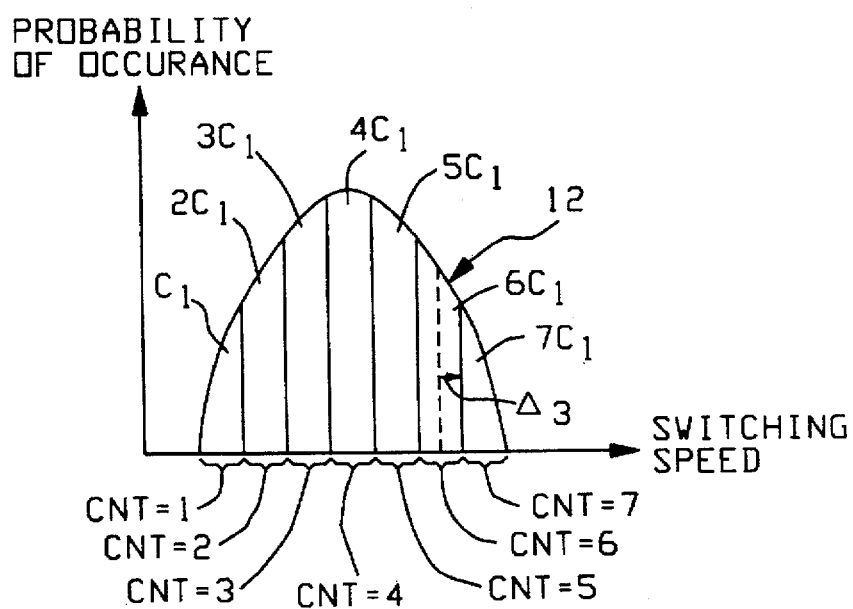
FIG. 9 is a graph which shows how various compensation components are used in the FIG. 8 circuit depending upon the switching speed of the transistors in the FIG. 8 circuit.

How the FIG. 8 embodiment operates is shown in FIG. 9. There the graph of FIG. 6 is repeated so that the complete range of the switching speeds for the transistors 20a and 20b is given on the horizontal axis and the corresponding probability for any particular switching speed to occur is given by the curve 12.

Also in FIG. 9, the range of switching speeds on the horizontal axis is partitioned into seven sub-ranges of equal width. These seven sub-ranges correspond to counts of one through seven in the up-counter 33'. A count of one in the up-counter 33' occurs when the switching speed of the transistors 20a and 20b are in the slowest speed sub-range of FIG. 9; a count of two in the up-counter 33' occurs when the switching speed of the transistors 20a and 20b is in the second slowest sub-range of FIG. 9; etc.

When the up-counter 33' holds a particular count, each bit in that counter which is high will couple a capacitor in the compensation module 40' to the inverters 20-1 through 20-3. For example, when the up-counter 33' holds a count of three, BIT20 and BIT21 will both be high. Thus, capacitor $C_1$ will be coupled by the pass gates 41 to the inverters 20-1 through 20-3; and simultaneously, capacitors $2C_1$ will be coupled by the pass gates 42 to the inverters 20-1 through 20-3. Likewise, when the up-counter 33' holds a count of five, $BIT2^0$ and $BIT2^2$ will both be high; and thus capacitors $C_1$ and $4C_1$ will be coupled by the pass gates 41 and 43 to the inverters 20-1 through 20-3.

Within the compensation circuit 40', the capacitors $C_1$, $2C_1$, and $4C_1$ which are selected by the pass gates are interconnected in parallel; and consequently, they add together. Thus, as the count in the up-counter 33' increments from one through seven, the total capacitance which is coupled to the inverters 20-1 through 20-3 also increments from $C_1$ to $7C_1$. This correlation between the count and the capacitance is shown in FIG. 9.

Since the overall switching speed range on the horizontal axis of FIG. 9 is partitioned into seven sub-ranges, the width of each sub-range is only one seventh of the total switching speed range. Thus, the tolerance $\Delta_3$ from the mean in each sub-range is only one seventh of the tolerance $\Delta_1$ from the mean of the overall speed range. Consequently, the control module 30' and the compensation module 40' of FIG. 8 reduce the tolerance in the delayed output signal $v_o$ and the pulse signal $v_p$ from module 20 by 700%.

Figure 10:
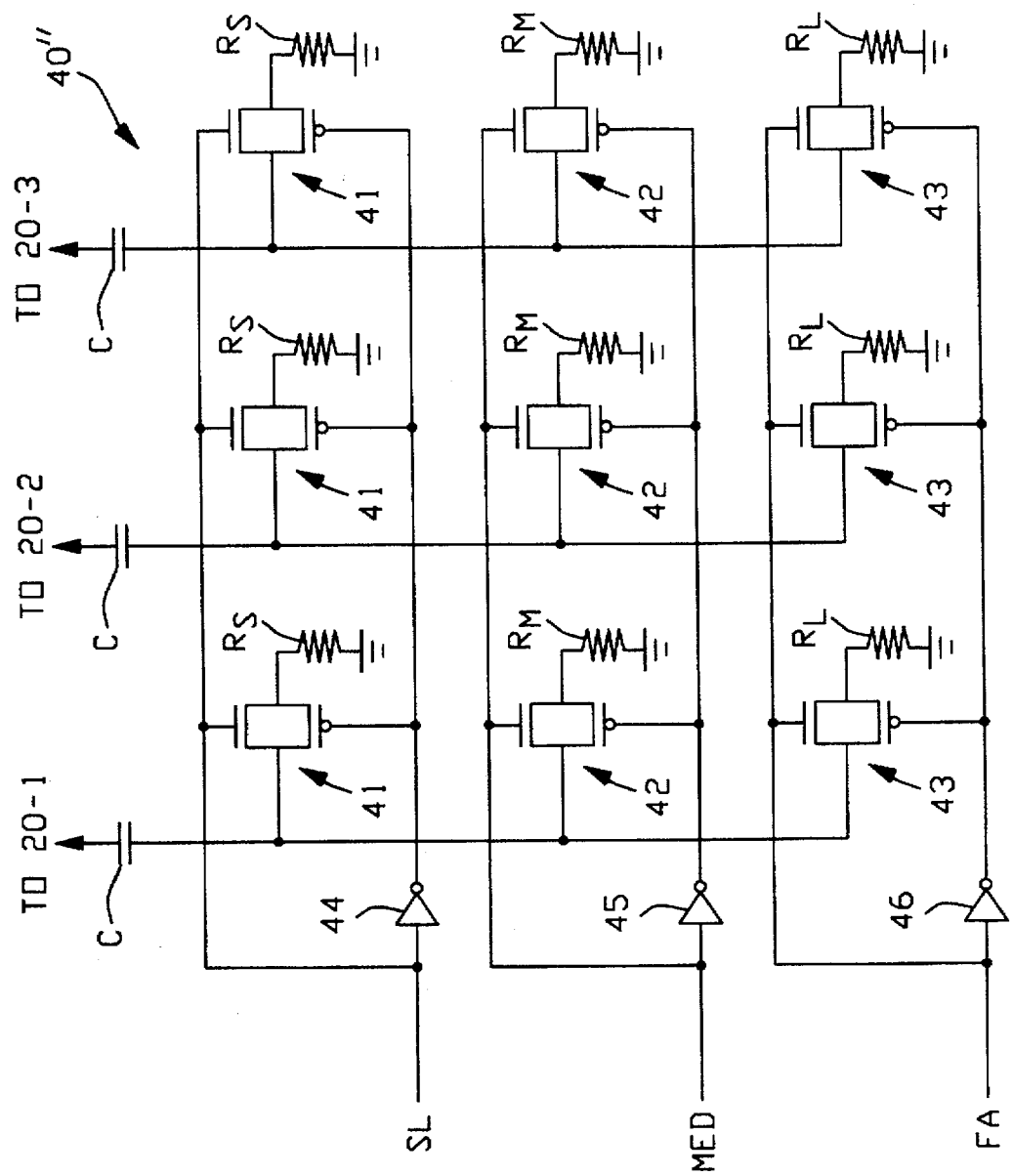
FIG. 10 is a circuit diagram of a third preferred embodiment of a precision delay/pulse generating circuit which incorporates the present invention.

As yet another modification, the compensation module 40 in the FIG. 4 embodiment can be changed as shown by module 40" in FIG. 10. All of the components within module 40" which are identical to components in module 40 of FIG. 4 have the same reference numeral.

One of the changes in module 40" is that each of the pass gates is connected to a respective resistor instead of a respective capacitor. A small resistor $R_S$ is connected to each of the pass gates 41; a medium resistor $R_M$ is connected to each of the pass gates 42; and a large resistor $R_L$ is connected to each of the pass gates 43. Also, a common capacitor C is inserted into each of the leads that connect module 40" to the serial string of inverters 20-1 through 20-3.

When signal SL is high, module 40" couples the small resistors $R_S$ through the pass gates 41 to the capacitors C. When signal MED is high, module 40" couples the medium resistors $R_M$ to the capacitors C. When the control signal FA is high, module 40" couples the large resistors $R_L$ to the capacitor C. By coupling the small resistors $R_S$ to the capacitors C, a small delay is added to the output signal $v_o$ of the serial string of inverters 20-1 through 20-3 because the capacitors C charge and discharge in a short time interval. Similarly, by coupling the medium resistors $R_M$ to the capacitors C, a medium delay is added to the output signal $v_o$. Likewise, by coupling the large resistors $R_L$ to the capacitors C, a large delay is added to the output signal $v_o$. These added delays substantially reduce the tolerance in the total delay of the output signal $v_o$ because they compensate for variations in the switching speed of the transistors 20a and 20b.

Up to this point in the Detailed Description, the focus has been on the structure and operation of a precision delay/pulse generating circuit by itself. However, in accordance with the present invention, the precision/delay pulse generating circuits of FIGS. 4–10 can be incorporated into several types of integrated circuit memories to increase operating speed and reduce power dissipation over the prior art. One preferred embodiment of such a high-speed low-power static memory is shown in FIG. 11, and the operation of that memory is shown in FIG. 12.

Figure 11:
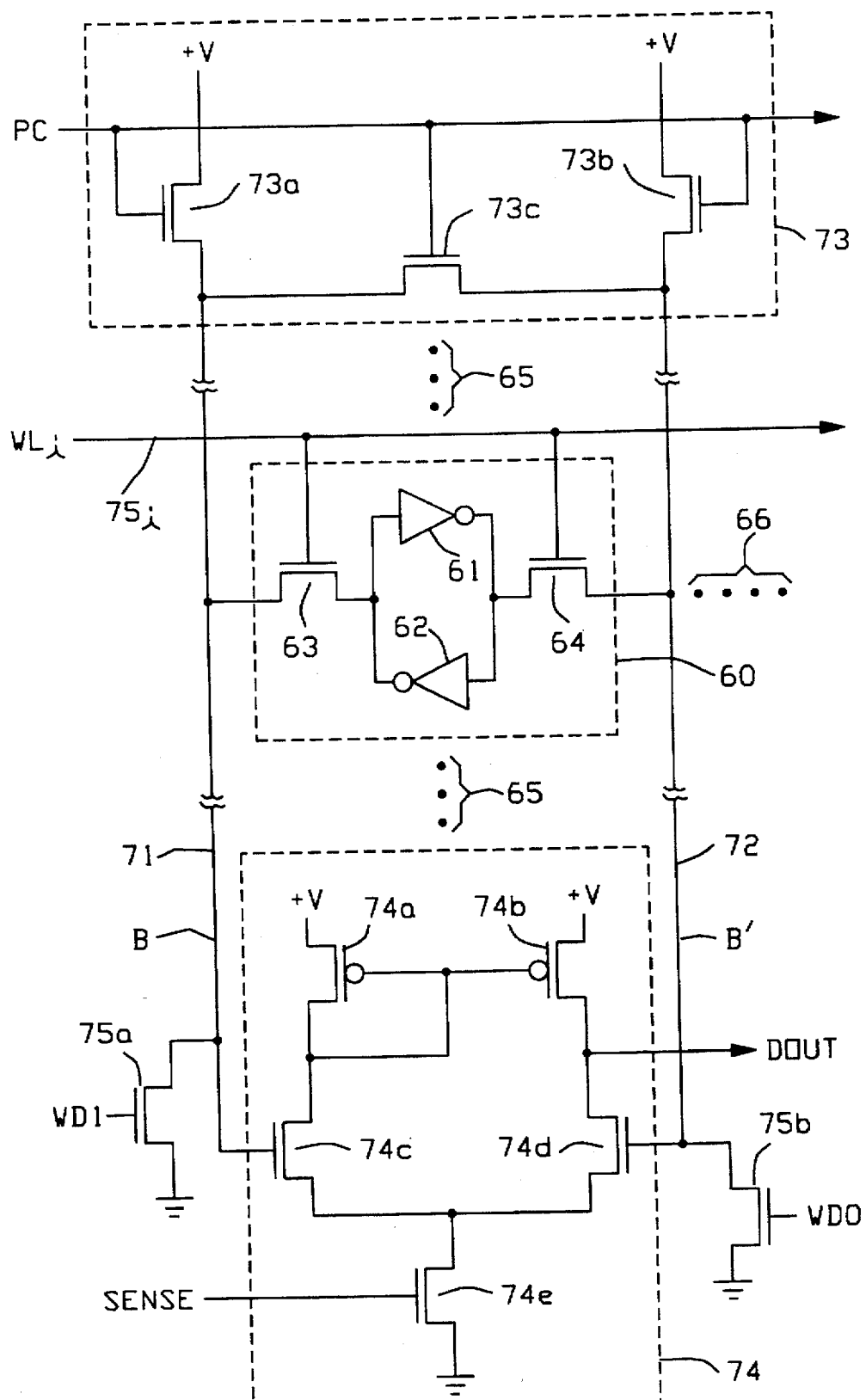
FIG. 11 is a circuit diagram of a static memory in which precharge signals, wordline signals, and sense signals are precisely generated with the present invention.
Figure 12:
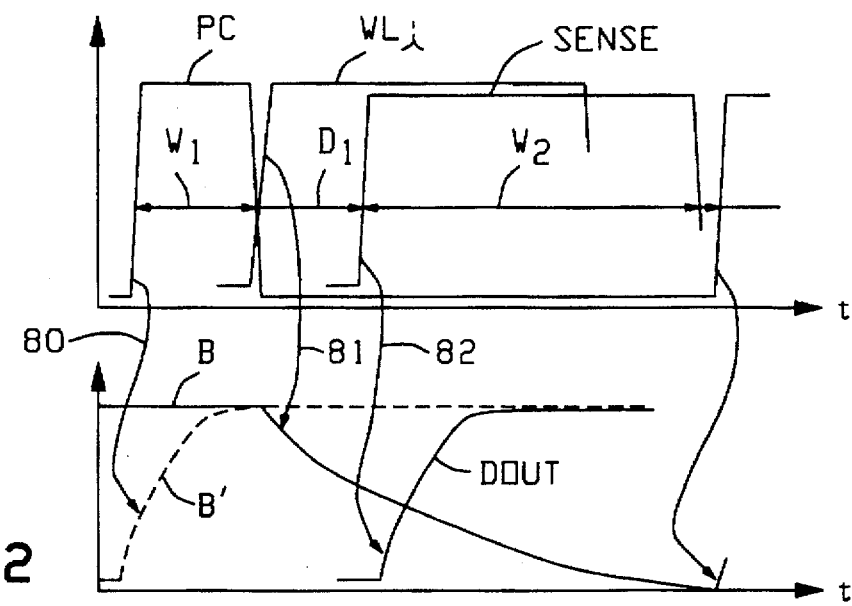
FIG. 12 shows the precharge signals, wordline signals, and sense signals in the FIG. 11 memory.

Included within the FIG. 11 memory is a plurality of static memory cells, one of which is identified by reference numeral 60. Each memory cell includes a cross-coupled pair of invertors 61 and 62 plus a pair of transistors 63 and 64. This memory cell 60 is replicated in columns as indicated by a set of dots 65 and it is replicated in rows as indicated by a set of dots 66.

All of the remaining components which are shown in FIG. 11 constitute a read/write circuit for the memory cells. This read/write circuit includes one pair of bit lines 71 and 72 for each column of memory cells, one precharge circuit 73 for each column of memory cells, a one sense amplifier 74 for each column of memory cells, and one pair of write data transistors 75a and 75b for each column of memory cells. Also, the read/write circuit includes a respective word line for each row of memory cells, one of which is identified by reference numeral 76i.

Precharge circuit 73 consists of three transistors 73a, 73b, and 73c. Sense amplifier 74 consists of five transistors 74a, 74b, 74c, 74d, and 74e. All of the components within the precharge circuit and the sense amplifier and the memory cells are interconnected as shown in FIG. 11.

To read data from the i-th row of memory cells, a precharge signal PC and a word line signal $WL_i$ and a sense amplifier signal SENSE are sent to the FIG. 11 memory in a particular sequence as shown in FIG. 12. First, the precharge signal PC is sent to the precharge circuit 73 as a pulse which has a width $W_1$. Then, starting at the end of the precharge pulse PC, the word line signal $WL_i$ goes high. Then, after a delay $D_1$, the sense amplifier signal SENSE goes high. This SENSE signal is a pulse which has a width $W_2$, and during that pulse the word line signal $WL_i$ goes low. After the sense pulse is completed, the entire signal sequence can be repeated.

The purpose of the precharge signal PC is to set the bit line 71 and 72 to a high voltage level which is the same for both bit lines. To achieve this, transistors 73a and 73b couple the bit lines to the supply voltage +V and transistor 73c couples the bit lines to each other. Consequently, when the precharge pulse PC begins, the voltages B and B' on the bit line 71 and 72 start to equalize at one transistor drop below the supply voltage +V. This is shown in FIG. 12 by reference numeral 80.

If the width $W_1$ of the precharge pulse PC is too short, then the voltages B and B' on the bit lines 71 and 72 will not have time to equalize and so memory read errors will occur. Conversely, if the width $W_1$ of the precharge pulse is too long, then the overall read cycle time for the memory will be too slow.

In order to achieve both a complete precharge and a fast cycle time, the width $W_1$ of the precharge pulse must be precisely controlled. And, in accordance with the present invention, this is achieved by generating the precharge pulse PC with the circuits of FIGS. 4 through 10.

After the precharge operation is complete, the word line signal $WL_i$ goes high to transfer data from one row of memory cells onto the bit lines. When this occurs, the voltage on one of the bit lines starts to drop from its precharge level while the voltage on the other bit line remains unchanged. This is shown in FIG. 12 by reference numeral 81.

The purpose of the delay $D_1$ is to allow the voltage on one of the bit lines to drop by a sufficient amount from the precharge level so that the difference in voltage between the two bit lines can be sensed by the sense amplifier 74. If the delay $D_1$ is too small, then the difference between the bit line voltages will be too small to be sensed properly; and consequently, memory read errors will occur. Conversely, if the delay $D_1$ is too long, then the overall read cycle time for the memory will be too slow.

In order to achieve both an adequate difference in the bit line voltages prior to the sense operation and maintain a fast read cycle time, the length of the delay $D_1$ must be precisely controlled. And, in accordance with the present invention, this is achieved by generating the delay $D_1$ with the circuits of FIGS. 4 through 10.

After the delay $D_1$, the SENSE signal goes high to allow the sense amplifier to amplify the voltage difference between the bit lines to a full one or full zero level and thereby generate a data output signal DOUT. This DOUT signal from the sense amplifier must be maintained long enough to be latched into a flip-flop (which is not shown in FIG. 11) so that the sensed memory data will be available for use for one complete memory cycle. Thereafter, the sense pulse can end and the precharge pulse for the next cycle can begin.

If the width $W_2$ of the sense pulse is too short, then the data output signal DOUT will not last long enough to be latched into a flip-flop; and consequently, memory read errors will occur. Conversely, if the width $W_2$ of the sense pulse is too long, then the overall read cycle time for the memory will be too slow.

In addition, if the width $W_2$ of the sense pulse is too long, then the power dissipation in the FIG. 11 memory will be too high. This is because during the sense pulse transistor 74e is on, and thus a current path is formed from the supply voltage +V to ground through the three transistors 74a, 74c, and 74e, or through the three transistors 74b, 74d, and 74e.

Thus, in order to provide a data output signal DOUT which is long enough to be latched and is short enough for a fast low-power cycle time, the width $W_2$ of the SENSE pulse must be precisely controlled. And, in accordance with the present invention, this is achieved by generating the SENSE pulse with the circuits of FIGS. 4 through 10.

Throughout the above-described read sequence, the write data signals WD1 and WD1 to transistors 75a and 75b are low. To write data into the FIG. 11 memory, the signal sequence of FIG. 12 is repeated with the following modifications. A "1" is written into a memory cell of the i-th row by generating signal WD1 as a high voltage when the word line signal $WL_i$ is high. A "0" is written into a memory cell of the i-th row by generating WD1 as a high voltage when the word line signal WXL is high.

Figure 13:
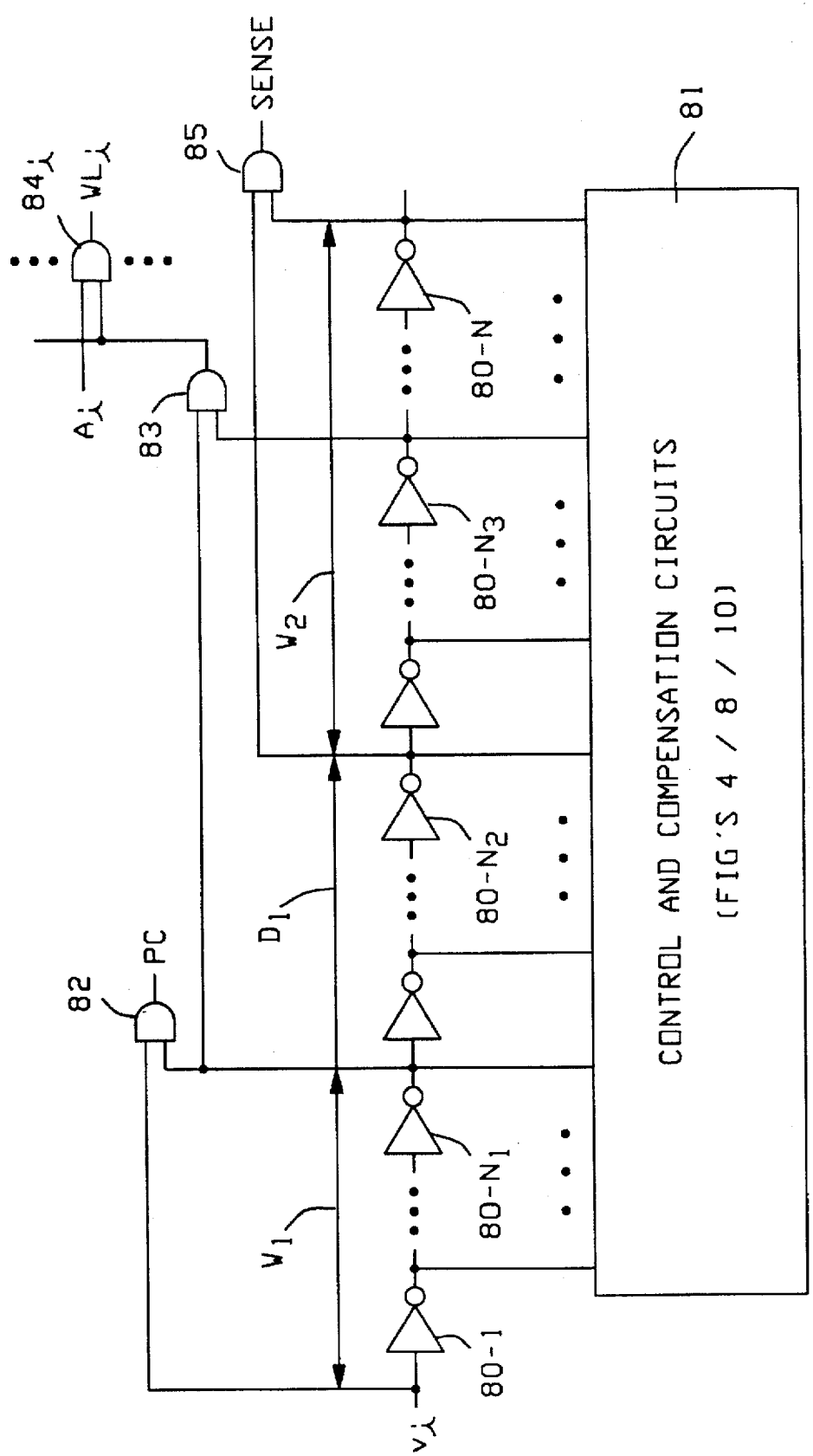
FIG. 13 is a circuit which generates the precharge signals, wordline signals, and sense signals as shown in FIG. 12 in accordance with the present invention.

Turning now to FIG. 13, it shows the structural details of a circuit which generates the precharge signal PC, the word line signals $WL_i$, and the SENSE signal in accordance with the present invention. This FIG. 13 circuit includes a serial string of N inverters 80-1 through 80-N, a control/compensation circuit 81, and several AND gates 82 through 85. All of these components are interconnected as shown in FIG. 13.

Control/compensation circuit 81 has the same internal structure as any of the previously described modules 30 and 40 of FIG. 4, or 30' and 40' of FIG. 8, or 40" of FIG. 10. If module 40 of FIG. 4 is used in circuit 81, then respective capacitors $C_S$, $C_M$, $C_L$ and respective pass gates 41, 42 and 43 are provided for each of the inverters 80-1 through 80-N. Similarly, if module 40" of FIG. 8 is used in circuit 81, then respective capacitors $C_1$, $2C_1$, $4C_1$, and respective pass gates 41, 42 and 43 are provided for each of the inverters 80-1 through 80-N. Likewise, if module 40" of FIG. 10 is used in circuit 81, then respective components $R_S$, $R_M$, $R_L$, C, 41, 42, and 43 are provided for each of the inverters 80-1 through 80-N.

To form the precharge signal PC, the input signal $v_i$ to the first inverter 80-1 and the output signal from inverter 80-$N_1$ are ANDed together by AND gate 83. To form the word line signal $WL_i$, the output signals from inverters 80-$N_1$ and 80-$N_3$ are ANDed together by AND gate 83. Then, the output signal from AND gate 83 is sent to respective AND gates for each word line, such as AND gate 84i, where it is gated with an address signal $A_i$ to thereby form the word line signal $WL_i$. To form the SENSE signal, the output signals from inverter 80-$N_2$ and inverter 80-N are ANDed together by AND gate 85.

In the FIG. 13 circuit, the number of inverters $N_1$ is selected such that the time delay which occurs in the inverter substring 80-1 through 80-$N_1$ by itself, plus the delay which is added by a control/compensation circuit 81, equals the desired width $W_1$ of the precharge signal PC. Likewise, the number of inverters after inverter 80-N, up to and including inverter 80-$N_2$ is selected such that the delay through those inverters bythemselves, plus the delay which is added by the control/compensation circuit 81, equals the desired delay $D_1$ between the start of the word line signal $WL_i$ and the start of the SENSE signal. Similarly, the number of inverters after inverter 80-$N_2$ up to and including inverter 80-N is selected such that the delay through those inverters, plus the delay which is added by the control/compensation circuit 81, equals the desired width $W_2$ of the SENSE signal.

A numerical example that illustrates the extent to which performance is improved in the FIG. 11 memory by the FIG. 13 circuit is as follows. Using the design rules for an actual 0.35 micron fabrication process, the FIG. 11 memory and FIG. 13 control circuit, were designed and simulated on a SPICE computer program. In this simulation, the FIG. 11 memory reads data properly when the parameters $W_1$, and $D_1$, and $W_2$ of the precharge, wordline, and sense signals respectively were 1.0 nanoseconds, 0.9 nanoseconds, and 3.0 nanoseconds. Due to the operation of the control/ compensation circuit 81 in FIG. 13, each of these parameters $W_1$, $D_1$ and $W_2$ have a tolerance which is insignificant.

By comparison, if the control/compensation circuit 81 is removed, then each of the parameters $W_1$, D, and $W_2$ will have a large tolerance due to the range of speeds at which the transistors 80-1 through 80-N turn on and off. Specifically, for the actual 0.35 micron fabrication process that was used, parameter $W_1$ varied from 1.0 to 2.78 nanoseconds; parameter $D_1$, varied from 0.9 to 2.50 nanoseconds; and parameter $W_2$ varied from 3.0 to 8.34.

Thus, to guarantee that the memory will always read properly regardless of whether the transistors 80-1 through 80-N have a fast or slow switching speed, a maximum cycle time of 2.78+2.50+8.34 nanoseconds must be used. This cycle time of 13.62 nanoseconds is 270% slower than the 4.9 nanosecond cycle time which is achieved with the control/ compensation circuit 81.

In the above-described FIG. 11 memory, the read/write circuit can be modified by eliminating transistor 73c. With this change, the bit lines 71 and 72 are equalized solely through the precharge transistors 73a and 73b. Alternatively, the read/write circuit can be modified by connecting the gate of the precharge transistors 73a and 73b to a fixed reference voltage. With this change, the bit lines 71 and 72 are equalized solely through the equalization transistors 73c.

Figure 14:
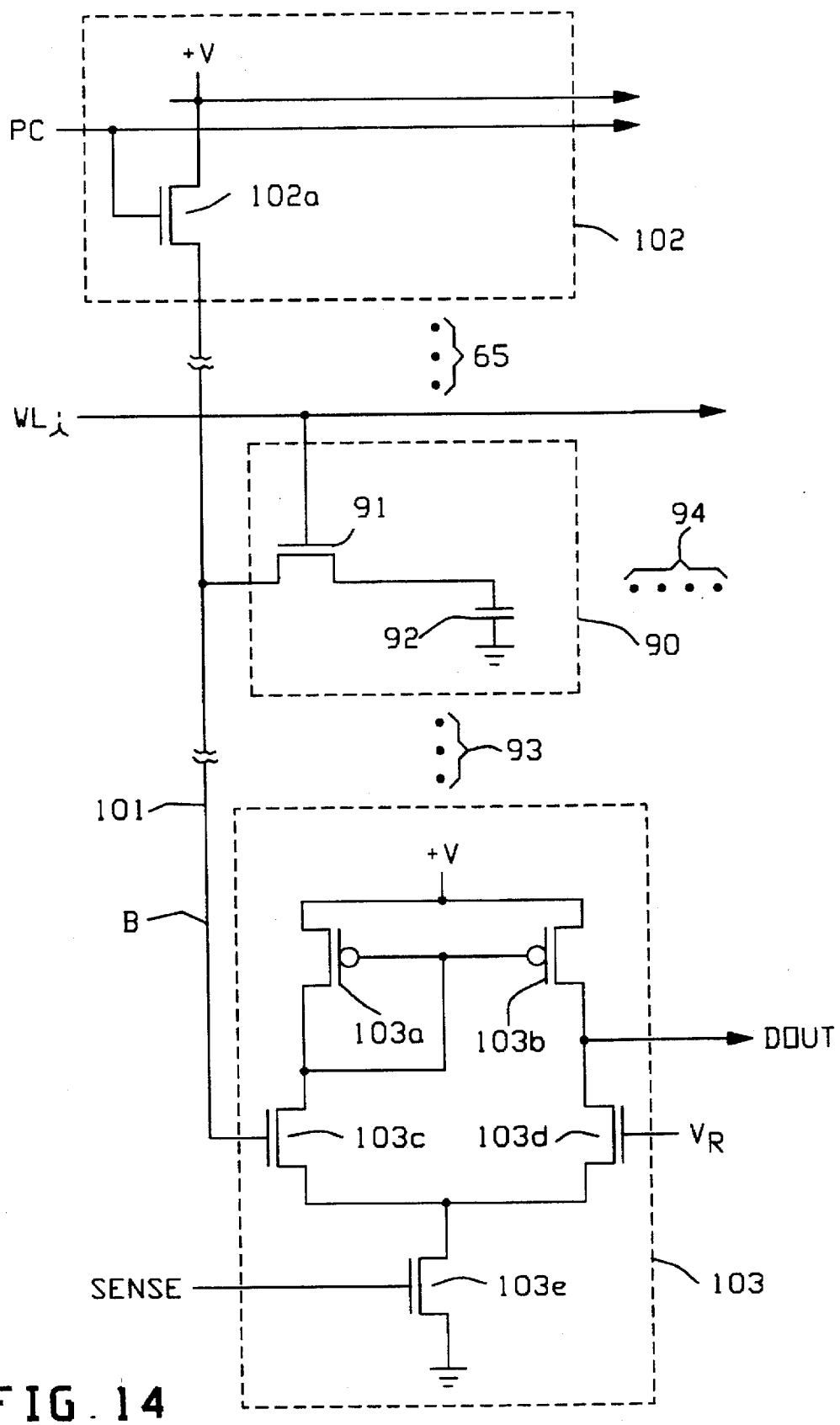
FIG. 14 is a circuit diagram of a dynamic memory in which the precharge signals, wordline signals, and sense signals are precisely generated with the present invention.

Considering next FIG. 14, it shows the structure of another integrated circuit memory in which the present invention preferably is incorporated to increase operating speed and reduce power dissipation over the prior art. This FIG. 14 memory is a dynamic memory, whereas the above-described FIG. 11 memory is a static memory.

Included within the FIG. 14 memory is a plurality of dynamic memory cells, one of which is identified by reference numeral 90. Each memory cell consists of a single transistor 91 and a single capacitor 92. This memory cell 90 is replicated in columns as indicated by a set of dots 93, and it is replicated in rows as indicated by a set of dots 94.

All of the remaining components which are shown in FIG. 14 constitute a read-write circuit for the memory cells. For each column of memory cells, this read/write circuit includes one single bit line 101 and one precharge circuit 102 and one sense amplifier 103 and one write data transistor 104. Also, the read/write circuit includes a respective word line for each row of cells, one of which is identified by reference numeral $105i$.

Precharge circuit 102 consists of a single transistor 102a. Sense amplifier 103 consists of five transistors 103a through 103e. All of the components within the precharge circuit and the sense amplifier and the memory cells are interconnected as shown in FIG. 14.

To read data from the memory cells in FIG. 14, the precharge signal PC and the word line signals $WL_i$ and the SENSE signal are sent to the memory in the same sequence which was described above in conjunction with FIG. 12. Also, everything which was said above with regard to the need to precisely control the pulse width $W_1$ and the signal delay $D_1$ and the pulse width $W_2$ also applies to the FIG. 14 memory. Consequently, to precisely generate the precharge signal PC and the word line signal $WL_i$ and the SENSE signal for the FIG. 14 memory, the above-described circuit of FIG. 13 preferably is used.

Figure 15:
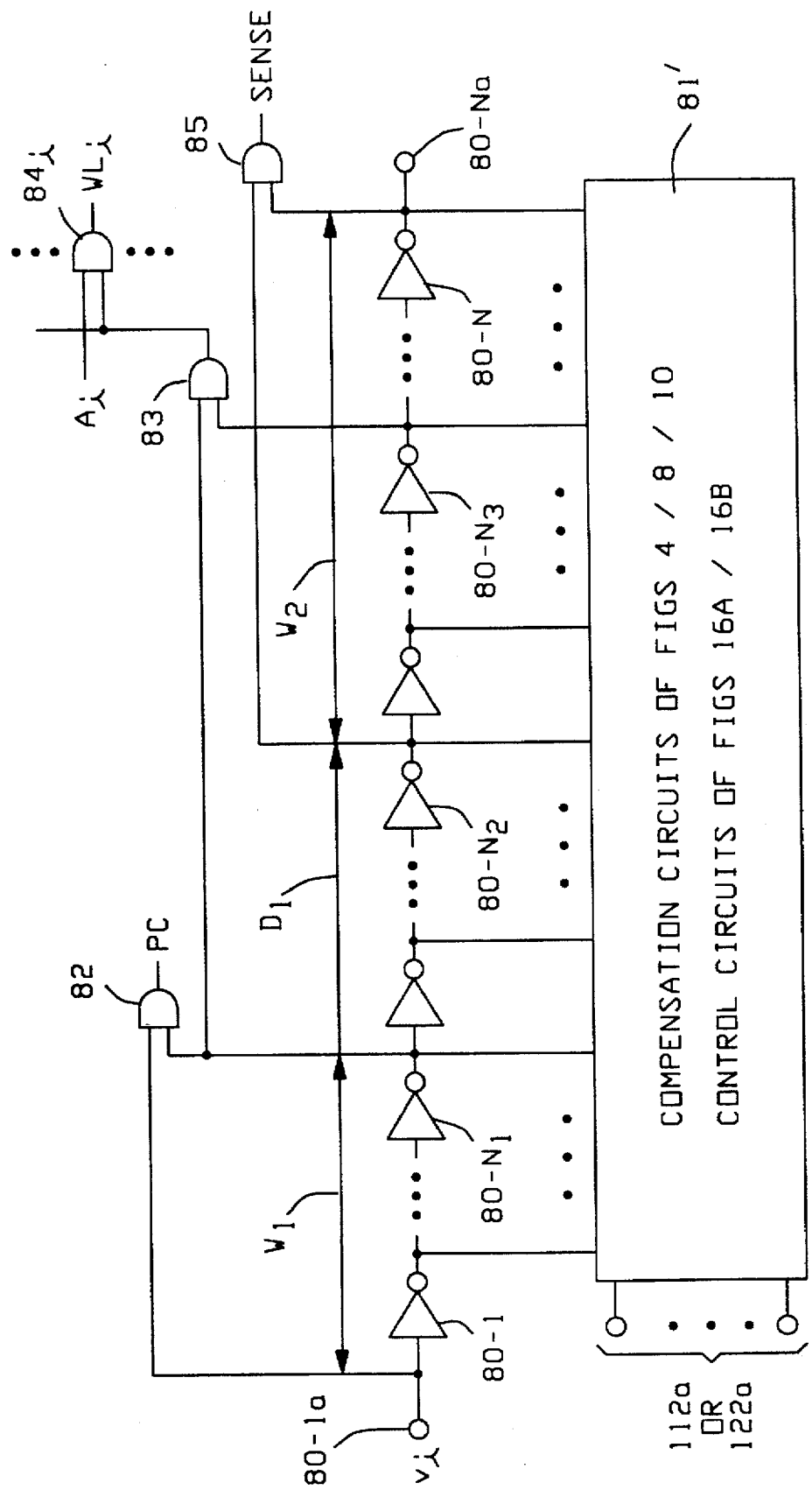
FIG. 15 is a circuit which is an alternative to the FIG. 13 circuit for generating the precharge signals, wordline signals, and sense signals for the memories of FIGS. 11 and 14.

As a modification, the precharge signal PC and the word line signals $WL_i$ and the sense amplifier signal SENSE for the static memory of FIG. 11 and the dynamic memory of FIG. 14 may be generated by the circuit of FIG. 15. This FIG. 15 circuit is a modification to the above-described FIG. 13 circuit, and those components in FIGS. 15 and 13 which are identical have the same reference numeral. For example, the serial string of inverters 80-1 through 80-N in FIGS. 15 and 13 are identical.

In FIG. 15, a major modification occurs in the control and compensation module 81' for the serial string of inverters 80-1 through 80-N. Specifically, module 80' includes any one of the previously described compensation circuits 40 of FIG. 4, or 40' of FIG. 8, or 40" of FIG. 10; but the control signals SL/MED/FA or $BIT2^0/BIT2^1/BIT2^2$ for those compensation circuits are generated by several of the control circuits 110 of FIG. 16A or 120 of FIG. 16B.

Figure 16A:
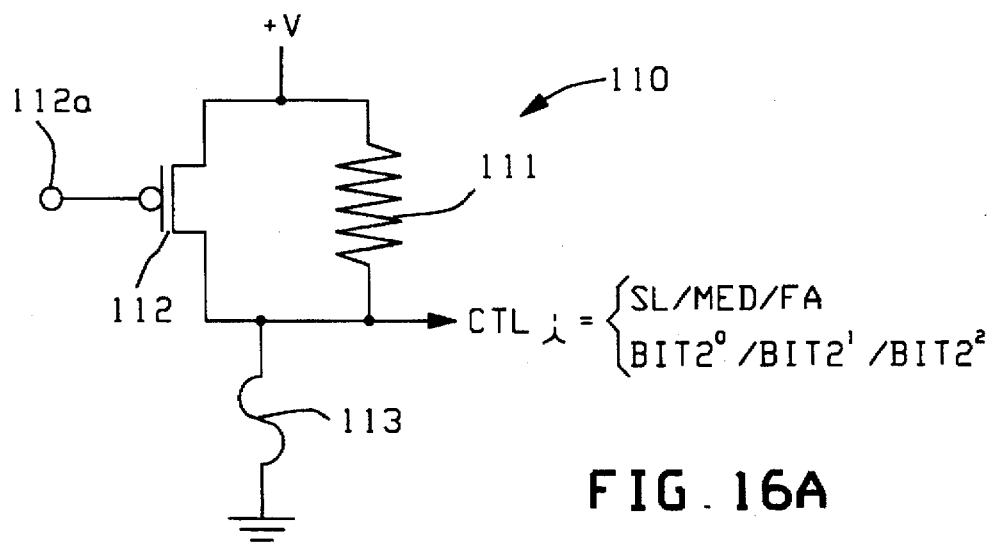
FIG. 16a shows a circuit which is used to generate control signals for the circuit of FIG. 15.

Control circuit 110 of FIG. 16A consists of a resistor 111, a transistor 112, and a fuse 113. All of these components 111 through 113 are interconnected as shown. Transistor 112 has an input terminal 112a which normally is an open circuit. So long as terminal 112a remains an open circuit, then the output control signal $CTL_i$ from circuit 110 will be a low voltage. But, if terminal 112a is temporarily grounded, then a current will flow through transistor 112 and fuse 113 which causes the fuse to open circuit; and consequently, the control signal $CTL_i$ will be a high voltage.

Figure 16B:
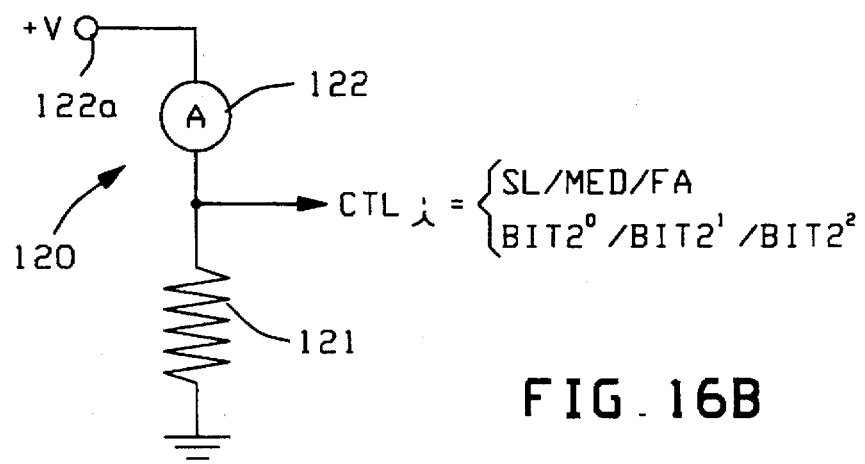

Control circuit 120 of FIG. 16B consists of a resistor 121 and an antifuse 122. Preferably, the antifuse 122 is structured as described in U.S. Pat. No. 5,407,851 which is entitled "Method of Fabricating An Electrically Alterable Resistive Component StackedAbove A Semiconductor Substrate", and which is assigned to the assignee of the present invention. Antifuse 122 has an input terminal 122a which receives a voltage +V that normally is below the threshold voltage of the antifuse. So long as the voltage +V on terminal 122a remains below the threshold voltage, then the output control signal $CTL_i$ from circuit 120 will be a low voltage. But, if the voltage +V on terminal 122a is temporarily raised above the threshold voltage of the antifuse, then the resistance through the antifuse 122 will switch from a high resistance to the low resistance; and consequently, the control signal $CTL_i$ will be a high voltage.

For each control signal $CTL_i$ that is needed by the compensation circuit 40, 40' or 40", a respective one of the control circuits 110 or 120 is used. For example, if the control circuit 110 is used to generate the control signals for the compensation circuit 40 of FIG. 4, then three of the control circuits 110 are used. One control circuit 110 will generate the SL control signal; a second control circuit 110 will generate the MED control signal; and a third control circuit 110 will generate the FA control signal.

Similarly, if control circuit 120 is used to generate the control signals for the compensation circuit 40' of FIG. 8, then three of the control circuits 120 will be used. One control circuit 120 will generate the $BIT2^0$ control signal; a second control circuit 120 will generate the $BIT2^1$ control signal; and a third control circuit 120 will generate the $BIT2^2$ control signal.

In order to determine which control signals $CTL_i$ should be generated as a high voltage level, the chip which contains the FIG. 15 circuits is provided with an input terminal 80-1a and an output terminal 80-Na. By applying a low-to-high voltage transition on terminal 80-1a while all of the control signals $CTL_i$ are low and monitoring the output signal which occurs on terminal 80-Na, the delay through the uncompensated serial string of inverters 80-1 . . . 80-N can be measured. Then, once that delay is known, the control signals $CTL_i$ from the control circuits 110 and 120 can selectively be generated as a high voltage level by selectively open circuiting the fuse 113 or short-circuiting the antifuse 122 as described above.

Preferably, the above steps of applying the low-to-high voltage transition on terminal 80-1a, measuring the delay in the output signal on terminal 80-Na, and selectively open circuiting the fuse 113 or short circuiting the antifuse 122 are performed just once per memory chip by a technician at the factory where the chip is made. Thereafter, when the memory chip is sold and used by a customer, input terminal 112a of control circuit 110 is always kept open and input terminal 122a of control circuit 120 is always kept below the antifuse threshold voltage.

Several preferred embodiments of the invention, as well as their features and advantages, have now been described in detail. Accordingly, it is to be understood that the invention is not limited to the details of any one particular embodiment but is defined by the structures recited in the appended claims and their equivalents.

What is claimed is:

1. A precision delay circuit, on an integrated circuit chip, which is comprised of:

a switching circuit which receives an input signal and contains transistors that switch on and off at an unpredictable speed to generate an output signal with an uncompensated delay that has a large tolerance;

a control circuit, in said chip, which generates control signals; and, a compensation circuit, which includes a plurality of compensation components, that receives said control signals from said control circuit and in response selectively couples said compensation components to said switching circuit;

characterized in that said control circuit includes a) a first module which estimates said unpredictable speed by generating a count which increases as said unpredictable speed increases, and b) a second module which generates said control signals such that the selectively coupled components add a compensating delay to said output signal which increases as said count increases, with the sum of said uncompensated and compensating delays having a substantially smaller tolerance than said large tolerance.

2. A delay circuit according to claim 1 wherein said first module generates an oscillating signal that oscillates at a frequency which is proportional to said unpredictable speed, and generates said count by counting cycles in said oscillating signal.

3. A delay circuit according to claim 2 wherein said first module generates said oscillating signal with a ring oscillator.

4. A delay circuit according to claim 3 wherein said ring oscillator is comprised of transistors which physically match said transistors in said switching circuit.

5. A delay circuit according to claim 1 wherein said compensation components include capacitors.

6. A delay circuit according to claim 1 wherein said compensation components include resistors.

7. A delay circuit according to claim 1 wherein said compensation circuit couples small capacitors to said switching circuit when said count indicates a slow speed, and couple large capacitors to said switching circuit when said count indicates a fast speed.

8. A delay circuit according to claim 1 wherein said compensation circuit couples small resistors to said switching circuit when said count indicates a slow speed, and couple large resistors to said switching circuit when said count indicates a fast speed.

9. A delay circuit according to claim 1 wherein said delay circuit is coupled to a logic gate which together with said delay circuit generates a pulse.

10. A delay circuit according to claim 1 wherein said large tolerance is at least 50% more than said substantially smaller tolerance.

11. A delay circuit according to claim 1 wherein said first module estimates said unpredictable speed as one of at least three quantized speeds and said second module generates said control signals such that they identify the one quantized speed which is estimated.

12. A delay circuit.according to claim 1 wherein said compensation components are arranged on said chip in at least three groups, and said compensation circuit selectively couples said compensation components to said switching circuit one group at a time.

13. A delay circuit according to claim 1 wherein said compensation components are arranged on said chip in at least three groups, and said compensation circuit selectively couples said compensation components to said switching circuit as a combination of said groups.

\* \* \* \* \*